US006781185B2

(12) United States Patent
Chen et al.

(10) Patent No.: US 6,781,185 B2
(45) Date of Patent: Aug. 24, 2004

(54) SEMICONDUCTOR HIGH DIELECTRIC CONSTANT DECOUPLING CAPACITOR STRUCTURES AND PROCESS FOR FABRICATION

(75) Inventors: Howard Hao Chen, Yorktown Hts, NY (US); Louis L. Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/091,193

(22) Filed: Mar. 5, 2002

(65) Prior Publication Data

US 2002/0163058 A1 Nov. 7, 2002

Related U.S. Application Data

(63) Continuation-in-part of application No. 09/579,044, filed on May 26, 2000, now abandoned.

(51) Int. Cl.[7] ........................ H01L 27/108; H01L 27/10

(52) U.S. Cl. ........................ 257/310; 257/301; 257/303; 257/309; 257/311; 257/532; 257/534; 257/211

(58) Field of Search ................................ 257/301, 303, 257/309, 310, 311, 532, 534, 211, 306, 308; 361/303, 305, 306.2, 309

(56) References Cited

U.S. PATENT DOCUMENTS

| | | | | | |
|---|---|---|---|---|---|
| 5,339,212 | A | * | 8/1994 | Geffken et al. | 361/306.2 |
| 5,739,579 | A | * | 4/1998 | Chiang et al. | 257/635 |
| 5,903,493 | A | * | 5/1999 | Lee | 365/149 |
| 5,909,043 | A | * | 6/1999 | Summerfelt | 257/298 |
| 6,265,280 | B1 | * | 7/2001 | Pan | 438/396 |
| 2002/0008301 | A1 | * | 1/2002 | Liou et al. | 257/531 |

* cited by examiner

*Primary Examiner*—Minhloan Tran
*Assistant Examiner*—Tan Tran
(74) *Attorney, Agent, or Firm*—Thu Ann Dang; Anne V. Dougherty

(57) ABSTRACT

Apparatus and method for providing high dielectric constant decoupling capacitors for semiconductor structures. The high dielectric constant decoupling capacitor can be fabricated by depositing high dielectric constant material between adjacent conductors on the same level, between conductors in successive levels, or both, to thereby provide very large capacitance value without any area or reliability penalty.

14 Claims, 13 Drawing Sheets

933
937
932
987
985
979
977
922
923
925
967
969
912
915
917
919
927
902
903
907
909
905
901

YOR9-1999-0420
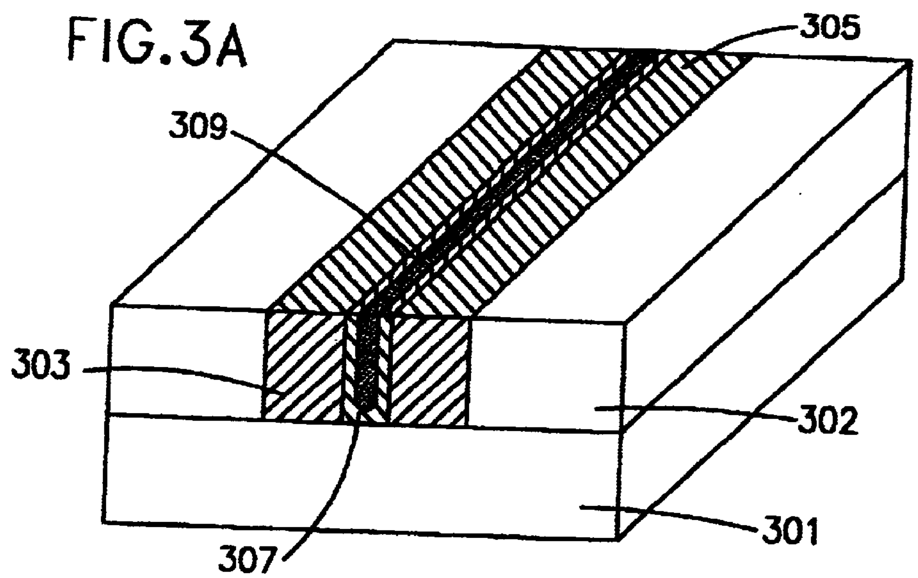
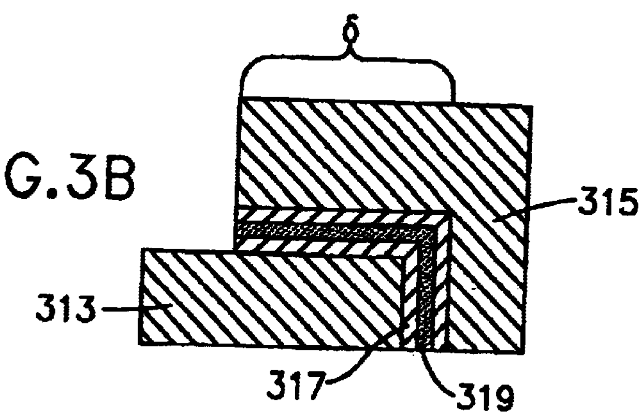
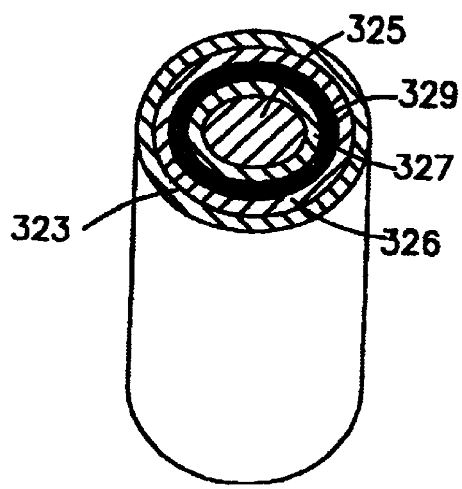

SEMICONDUCTOR HIGH DIELECTRIC CONSTANT DECOUPLING CAPACITOR STRUCTURES AND PROCESS FOR FABRICATION

This is a continuation-in-part of application Ser. No. 09/579,044, filed May 26, 2000 now abandoned.

FIELD OF THE INVENTION

This invention relates to semiconductor capacitors and more particularly to a system and method for forming high dielectric constant decoupling capacitors for semiconductor structures.

BACKGROUND OF THE INVENTION

Materials having a high dielectric constant are particularly well suited for use in decoupling capacitors. High dielectric constant materials include ferroelectrics, relaxors, paraelectrics, perovskites, pyrochlores, layered perovskites or any material with a dielectric constant which is greater than or equal to 20. Examples of such materials include $Ta_2O_5$, $BaTiO_3$, $SrTiO_3$, $BaStTiO_3$ (BST or BSTO), $PbZrTiO_3$ (PZT), $PbZrO_3$, $PbLaTiO_3$ (PLT), and $SrBiTiO_3$ (SBT).

Ferroelectric decoupling capacitors utilize the ferroelectric effect, which is the tendency of small electrically asymmetric elements, called dipoles, to spontaneously polarize, or align in parallel, within certain crystals when under the influence of an externally applied electric field. The elements remain polarized after the electric field is removed. However, when a reverse electric field is applied, the reverse electric field causes spontaneous polarization (i.e., alignment of the dipoles) in the opposite direction. Thus, ferroelectric materials have two stable polarization states, and can be utilized in bistable capacitors having two distinct polarization voltage thresholds. Since no external electric field or current is required for the ferroelectric material to remain polarized in either state, a capacitor can be fabricated which can store charges without requiring power to retain the stored charges.

Ferroelectric (FE) films that are used as storage elements have relative dielectric constants which are a few orders of magnitude higher than that of silicon dioxide (e.g., 1000–1500 versus 3.8–7.0 for typical DRAM capacitors). Thus a thicker film can be used to provide high capacitance. Lead zirconate titanate (PZT) has been most commonly used and studied. A ferroelectric capacitor using lead zirconate titanate (PZT) film can store a large charge, e.g., 10 uC/cm2, compared to an equivalent sized SiO2 capacitor that may store only 0.1 uC/cm2. Ferroelectric films such as PZT remain ferroelectric from −80 to +350° C., which is a range well beyond the operating temperature of existing silicon devices. Also, the processing requirements for a PZT ferroelectric capacitor are compatible with conventional semiconductor wafer processing techniques and semiconductor packaging processing techniques.

The earliest ferroelectric thin film was made of potassium nitrate and lead zirconate titanate (PZT). The storage capacitor was constructed from two metal electrodes thin FE film inserted between the metallization layers. High dielectric constant materials, such as $Ta_2O_5$, have been used in the packages as discrete devices for decoupling purposes. FIG. 1 shows a typical hysteresis I-V switching loop for the PZT film and operating characteristics. For positive voltages greater than the coercive voltage (Vc) applied to the ferroelectric capacitor, the film is polarized in the positive direction to a saturation value of Ps. The coercive voltage (Vc) is defined as the value where polarization reverses and the curve crosses the X-axis. On removal of the applied voltage, the polarization relaxes to a value Pr called the remnant polarization. On the application of negative voltage to the ferroelectric film, the resulting polarization is in the negative direction, reaching a saturation value of −Ps and a remnant (or relaxed) polarization of −Pr.

For a ferroelectric capacitor, once the capacitor is charged during the initial operation or the burn-in process with a voltage higher than Vr, the capacitor will remain at a capacitance value near the maximum capacitance even when the power supply is removed. To change the direction of this polarization, a negative voltage greater than −Vr has to be applied to reverse the polarization. Thus, the decoupling effect of the capacitor can be maintained even when no power is being supplied to the device. This can effectively negate any transient noise which would otherwise be encountered during the onset of the power supply.

As described in the prior art, (see: e.g., "Preparation and properties of sol-gel derived PZT thin films for decoupling capacitor application", Schwartz, R. W. Dimes, D. Lockwood, S. J. Torres, V. M., Integrated Ferroelectrics v.4 no.2 March 1994, pp.165–174; and "Electrical properties of sol-gel PZT thin films for decoupling capacitor applications", Schwartz, Robert W. Dimos, D. Lockwood, S. J. Torres, V. M., Ferroelectric Thin Films III Materials Research Society Symposium Proceedings v.310, 1993. pp.59–64), ferroelectric material capacitors have been used in packaging where noise has been a more serious problem. However, as the more recent chip technology pushes into higher speed, denser interconnects, and larger chip area, the noise in the power supply lines due to circuit switching becomes a common problem for the chip applications. It is proposed that, by adding decoupling capacitors on the chip, located in close proximity to the circuit, one can effectively reduce the power supply noise. In order to limit the surge of noise to a desired level, the value of the decoupling capacitance is typically 5 times that of the line loading capacitance.

Two alternative prior art on-chip capacitors are illustrated in FIGS. 2A and 2B. FIG. 2A illustrates a planar capacitor which uses the gate dielectric 201 between the gate electrode 202, which is connected to the voltage source and acts as the plate node, and the source and drain regions 203 and 204 in n-type substrate 205 over a p-type well, wherein the source and drain regions are connected to ground as the ground node. FIG. 2B illustrates an alternative on-chip capacitor which uses the DRAM deep trench dielectric for storing charges. The transfer gate 212 connected to the voltage source serves as the plate node with trench material 222, while the n+ region surrounding the trench is the ground node, with the trench dielectric 211 storing the charges between the two. While prior art on-chip capacitors have been fabricated, the former embodiment of FIG. 2A relies on the gate dielectric which is generally an oxide having a relatively low dielectric constant, and is therefore, not a terribly effective capacitor. The latter embodiment of FIG. 2B also relies on the existing dielectric material with its low dielectric constant and is more costly in terms of substrate real estate and processing complexity.

What is desired, and what is an object of the present invention, therefore, is to provide a compact size, high capacitance value, reliable decoupling capacitor using ferroelectric material, which capacitor can be integrated into the silicon interconnect process for semiconductor packaging and for on-chip applications with minimum added cost.

SUMMARY OF THE INVENTION

The foregoing and other objects of the invention are realized by the present invention which provides ferroelectric decoupling capacitors on the semiconductor chip and on semiconductor chip packaging. The ferroelectric decoupling capacitor can be fabricated between adjacent lines on the same level, between lines of successive levels, or both, thereby providing large capacitance value without any penalty in terms of area or reliability.

BRIEF DESCRIPTION OF THE DRAWINGS

The invention will now be described in greater detail with specific reference to the appended drawings wherein:

FIGS. 3A through 3C provide schematic views of lateral decoupling capacitor in accordance with the present invention;

DETAILED DESCRIPTION OF THE INVENTION

Figure 1:
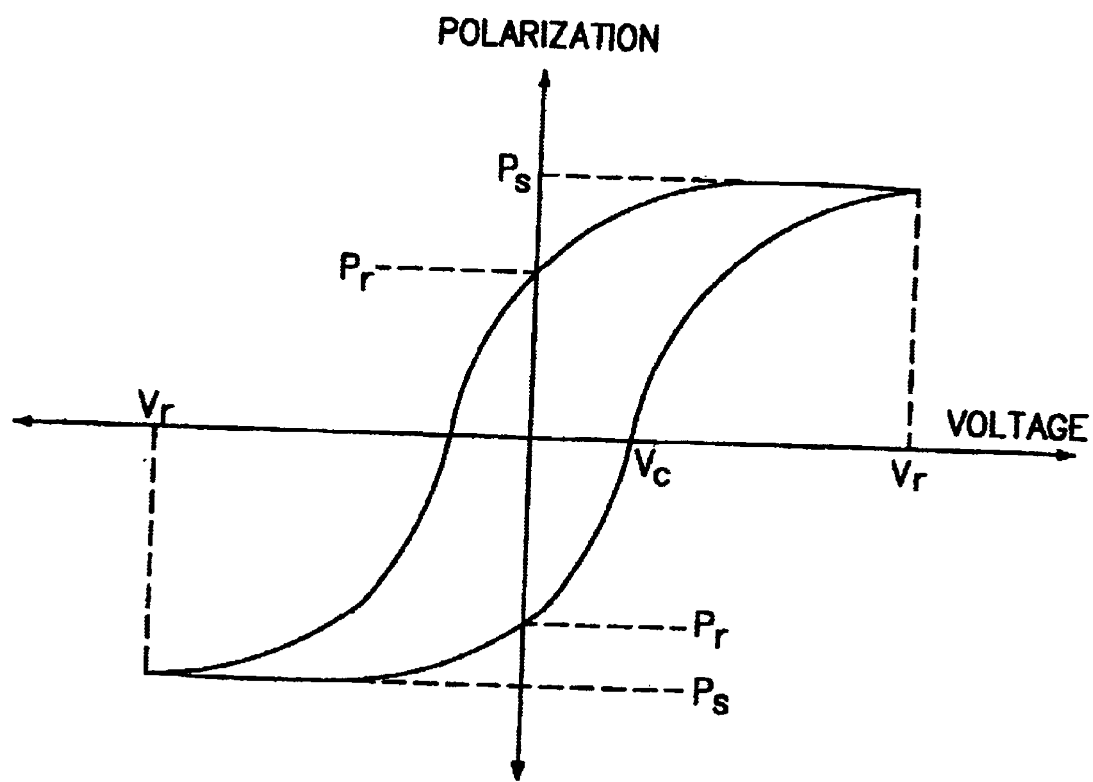
FIG. 1 shows a typical hysteresis I-V switching loop for a PZT ferroelectric film and operating characteristics therefor.
Figure 2A:
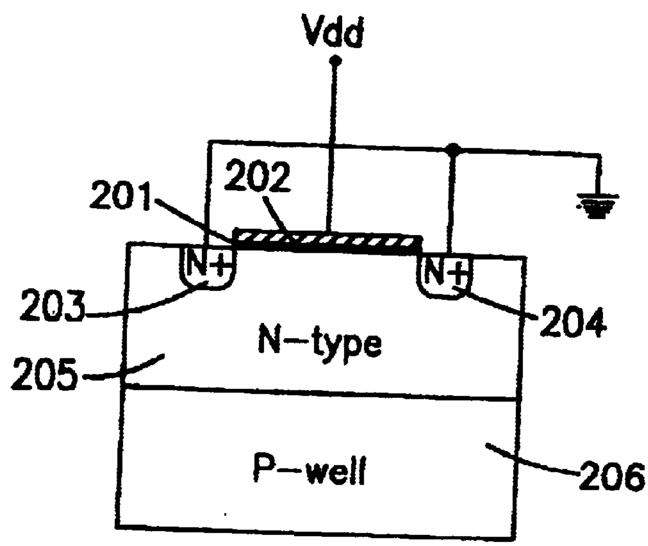
FIG. 2A shows a first alternative prior art implementation of a planar on-chip capacitor.
Figure 2B:
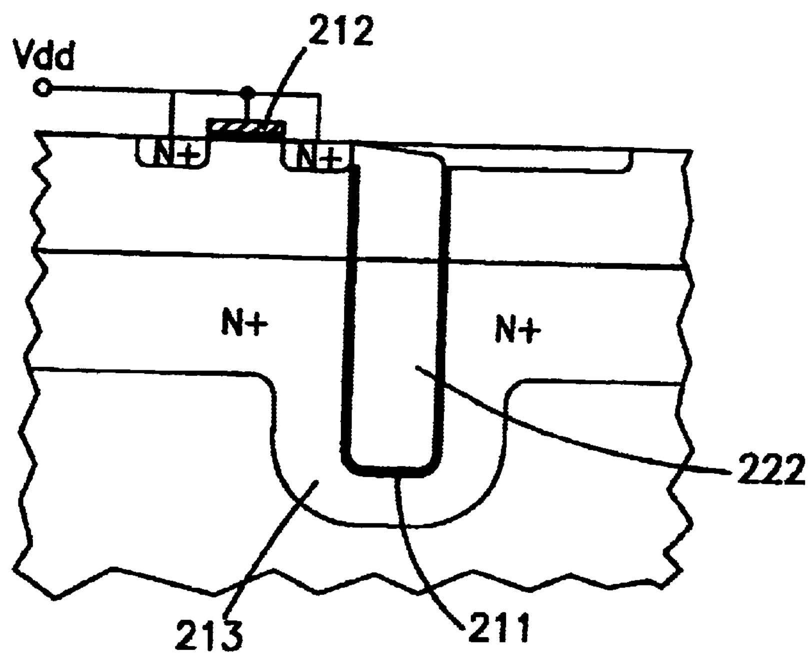
FIG. 2B shows a second alternative prior art implementations of a deep trench on-chip capacitor.

In accordance with the present invention, a high dielectric constant material, which is process-compatible with the semiconductor chip processing, is provided between adjacent metal lines and/or adjacent metal layers on the chip itself. In yet another embodiment, the high dielectric constant material is provided between metal lines and/or between metal layers in a semiconductor packaging structure. The high dielectric constant material is chosen from the group consisting of ferroelectrics, relaxors, paraelectrics, perovskites, pyrochlores, layered perovskites or any material with a dielectric constant which is greater than or equal to 10. Examples of such materials include $Ta_2O_5$, $BaTiO_3$, $SrTiO_3$, $BaStTiO_3$ (BST or BSTO), $PbZrTiO_3$ (PZT), $PbZrO_3$, $PbLaTiO_3$ (PLT), and $SrBiTiO_3$ (SBT). In addition, any other dielectric material having a dielectric constant which is 2–3 times higher than that of conventional oxide, and which is process-compatible with the semiconductor chip processing (e.g., silicon nitride, aluminum oxide, $TiO_2$ $HfO_2$, etc.), can be used. Hereinafter, all eligible materials will be generically referred to as "high-k" materials.

FIG. 3A provides a schematic side perspective view of a lateral high-k decoupling capacitor in accordance with the present invention. Metal lines 303 and 305 are disposed on the insulating substrate 301 in insulating dielectric 302 (e.g., silicon dioxide, phosphosilicate glass, borophosphosilicate glass, polymer, polyimide, diamond, diamond-like material, and the like). The conductive material for the metal lines may be a conventional metal or metal alloy such as Cu, Al, Mo, TiN or W, but is more advantageously a noble metal such as PT, Pd, Ir, Au, Rh, an alloy of a noble metal, a metal whose oxide is conducting, such as Ru or Mo, or another electrically conducting oxide. The conductive material will hereinafter be generically referred to as "metal". Between the metal lines 303 and 305 is deposited the high-k material 309. The high-k material is selected from the materials listed above. Depending upon the choice of materials used, including the line metal and the high-k material, it may be advantageous to provide an electrically conductive diffusion barrier 307 before depositing the high-k material 309 between the lines 303 and 305. Suitable materials for the electrically conductive diffusion barrier include $RuO_2$, $IrO_2$, $Re_2O_3$, TaN, TaSiN, TiN or similar materials.

It is to be noted that the "lateral" embodiment of the present invention can implemented in a variety of configurations wherein the high-k material is disposed between metal components which are in the same plane and are co-extensive along that plane. As shown in FIG. 3B, the metal line 313 is co-extensive with metal line 315 along distance $\delta$ and along the width of metal line 313. The diffusion barrier 317 is disposed along the co-extensive edges, with high-k material 319 deposited therebetween.

In the FIG. 3C implementation, an outer metal component 323 surrounds the first diffusion barrier 327, high-k material 329, second diffusion barrier 326 and inner metal component 325.

Figure 4A:
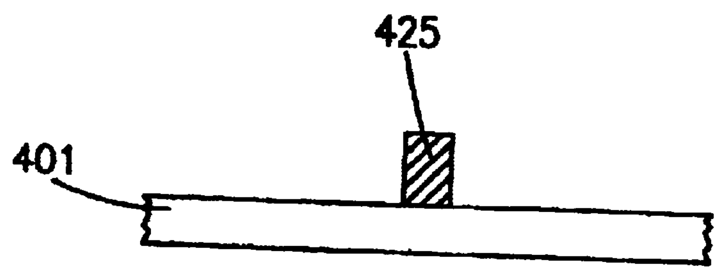
FIGS. 4A through 4G provide side cutaway views of a process flow for fabricating the structure of FIG. 3C.
Figure 4B:
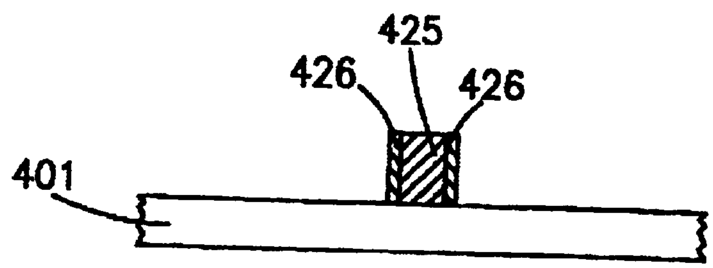
Figure 4C:
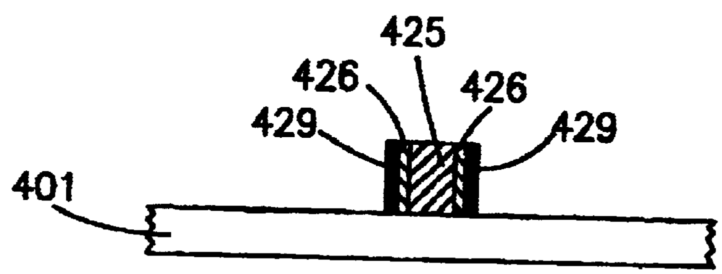
Figure 4D:
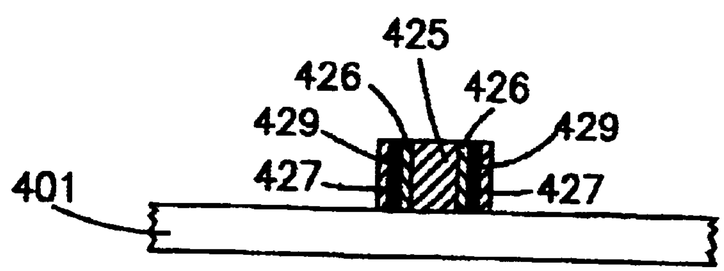
Figure 4E:
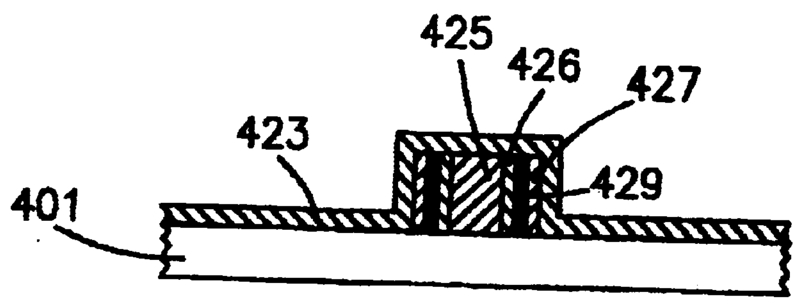
Figure 4F:
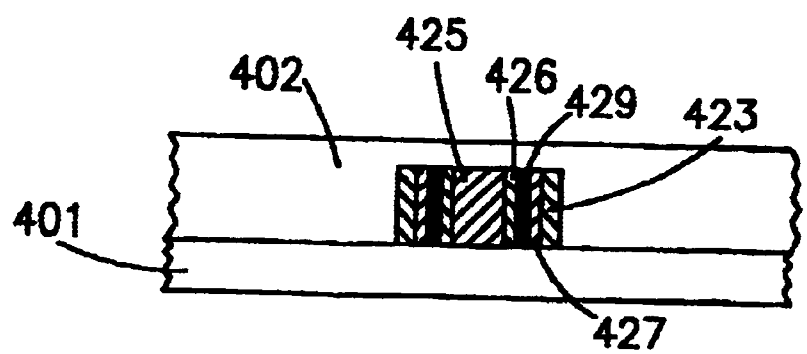
Figure 4G:
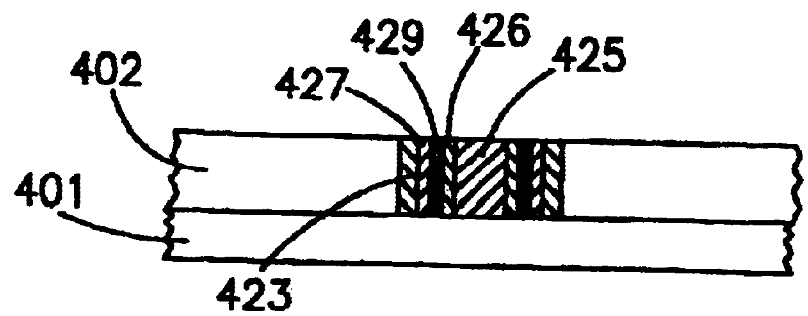

FIGS. 4A through 4G illustrate side cutaway views of the processing steps for fabricating the structure illustrated in FIG. 3C. On substrate 401 is formed an inner metal stud 425 by blanket deposition followed by patterning by etching with a photoresist mask; Next, as shown in FIG. 4B, a thin layer 426 of an electrically conductive diffusion barrier material is deposited and patterned to remain along the sidewalls of the metal stud 425. The high-k material 429 is deposited along the sides of the structure, adjacent to the diffusion barrier material 426, as shown in FIG. 4C. A second electrically conductive diffusion barrier layer 427 is provided along the sides of the structure abutting the high-k material 429, as shown in FIG. 4D. Next, the outer conductor 423 is blanket deposited over the structure and the substrate 401, as depicted in FIG. 4E, followed by etching back to remove the metal 423 from the top of the structure and from the substrate. A blanket oxide or other insulating dielectric material 402 is blanket deposited over the structure, as shown in FIG. 4F, followed by polishing back to expose the top surfaces of the cylindrical conductor structure of FIG. 4G.

Figure 5:
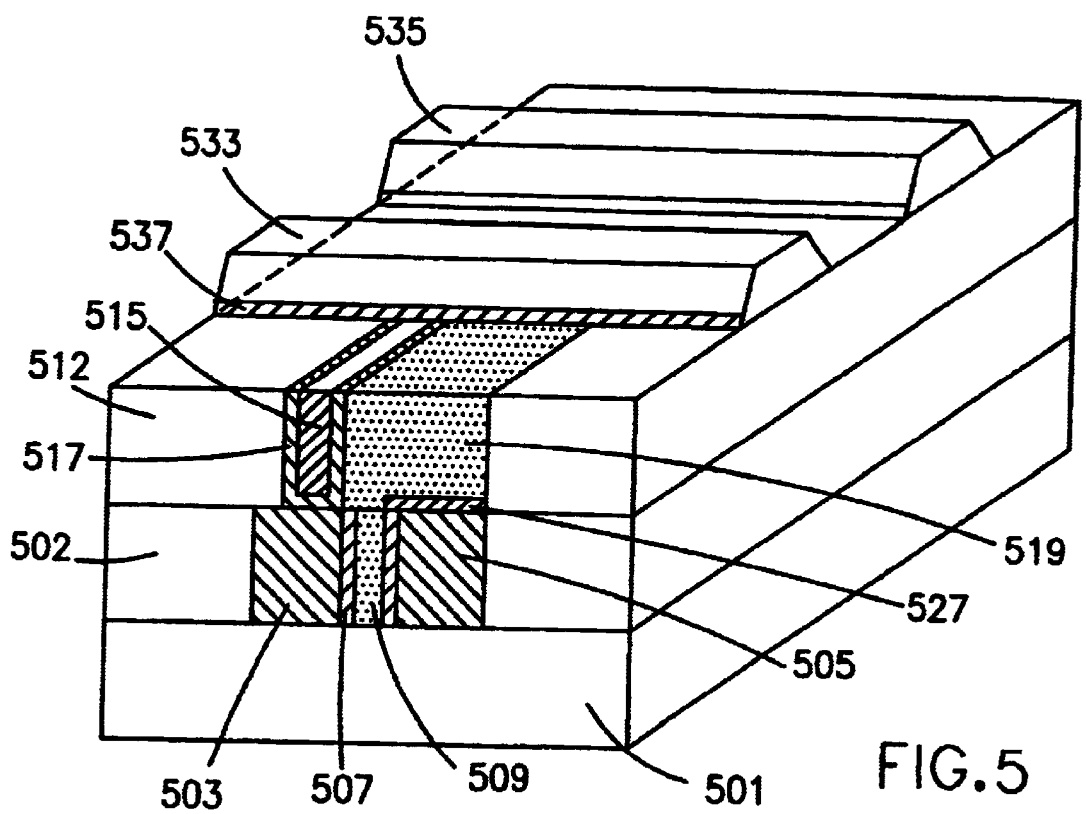
FIG. 5 provides a side perspective view of an alternative vertical embodiment of a decoupling capacitor in accordance with the present invention.

FIG. 5 provides a side perspective view of an alternative embodiment of a high-k decoupling capacitor in accordance with the present invention wherein the high-k material is vertically disposed between metal lines on the semiconductor substrate. The materials which are suitable for the lateral embodiment would necessarily be appropriate for the vertical embodiment and will not be repeated herein. The vertical capacitor is formed of metal line 505, metal line 515 and high-k material 519. The metal line 505 is formed in dielectric layer 502 on substrate 501. A diffusion barrier layer 527 is disposed between the metal line 505 and the high-k material 519. In addition, a diffusion barrier layer 527 is needed to isolate the high-k material from the underlying metal 505. Further, a conducting metal liner 517 is disposed in layer 512 to ensure adhesion of the metal stud 515. Metal stud 515 is formed in dielectric layer 512 and provides an interconnection between the underlying metal line 503 and the upper metal wire 533. Another diffusion barrier layer 537 is disposed and patterned on the surface of the structure prior to depositing metal lines 533 and 535. The resulting structure, therefore, includes both vertical and lateral capacitors.

Figure 6:
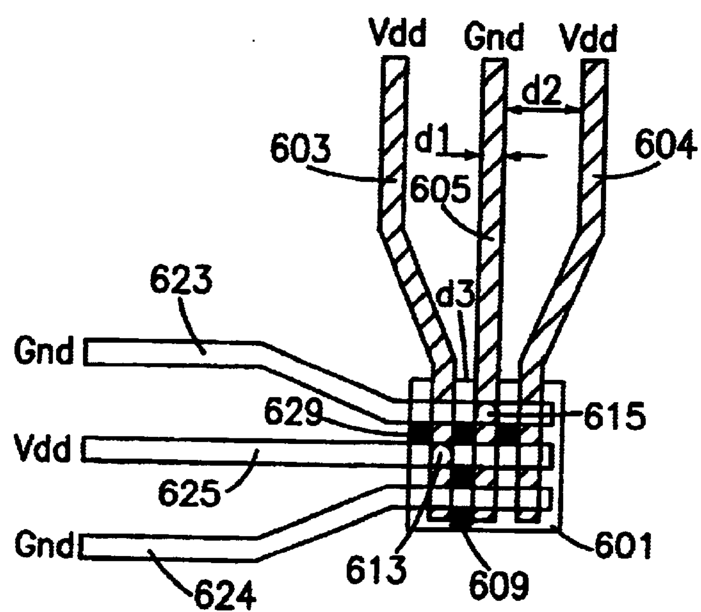
FIG. 6 provides a top view of a semiconductor structure in accordance with the present invention, which includes lateral decoupling capacitors both between adjacent interconnect lines on a level and vertical decoupling capacitors between interconnect levels.

FIG. 6 provides a top view of a semiconductor structure in accordance with the present invention, which includes lateral high-k decoupling capacitors both between adjacent interconnect lines on a level and vertical decoupling capacitors between interconnect levels. As depicted therein, two lower level metal lines, 603 (e.g., Vdd or supply voltage) and 605 (e.g., Gnd or ground) are formed with a narrow (e.g., 0.1 to 2 micron) gap therebetween. The high-k material 609 is formed in the gap between the two lines, whereby Vdd has a high-k decoupling capacitor with one node connected to Vdd and the other to ground. For such a capacitor, at least a portion of the power bus itself serves as the node plate of the decoupling capacitor. Similarly, the pair of power-ground lines 623 and 625 on the upper level will also have a high-k decoupling capacitor 629 formed between the two lines. In addition, high-k capacitors (not shown) can be formed between the lower level Vdd line 603 and the upper level Gnd line 623 and between the upper level Vdd line 625 and the lower level Gnd line 605. Where interconnection between wiring levels is shown, at contact 613 between lower level Vdd line 603 and upper level Vdd line 625 and ground-to-ground at contact 615, the interlayer high-k material (not shown, 519 of FIG. 5) provides the capacitance between the successive level metal lines.

Usually, metal lines are patterned with a width d1 and an interline space which is greater than the minimum design ground rule d2 (e.g., generally, 0.5 to 10 microns). In order to effectively use the high-k decoupling capacitor between the lines, it is desirable to have the metal lines closely packed, at a spacing shown as d3 (e.g., in the range of 0.1 to 2 microns). The narrower the space, the higher the capacitance. Similarly, at the next level, the lines are closely spaced. While it is not necessary that the same spacing be applied in successive layers, the same narrow spacing can be advantageously used for providing the interlevel capacitors.

Figure 7A:
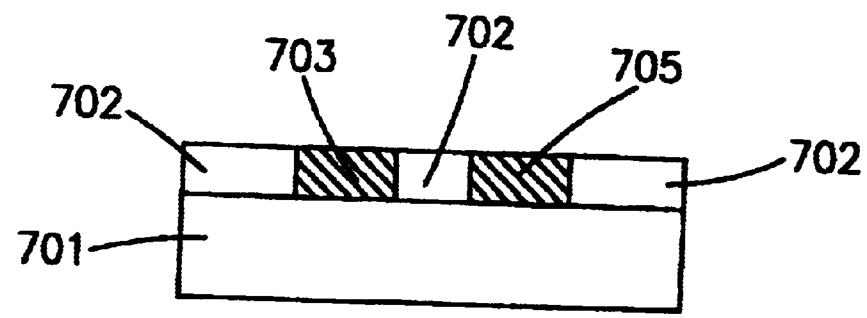
FIGS. 7A through 7F provide illustration of a process flow for fabricating the on-chip decoupling capacitor of FIG. 3A.
Figure 7B:
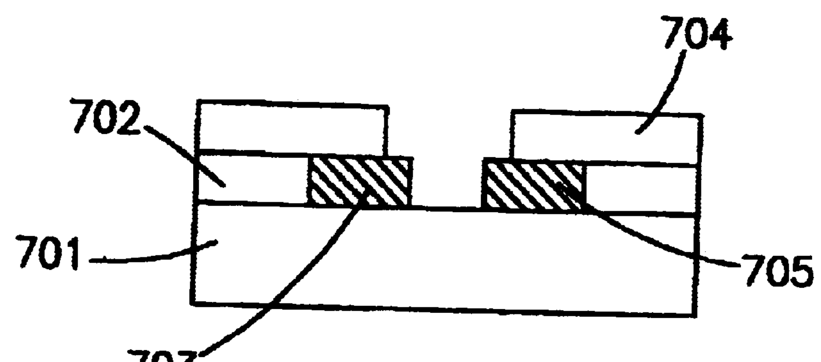
Figure 7C:
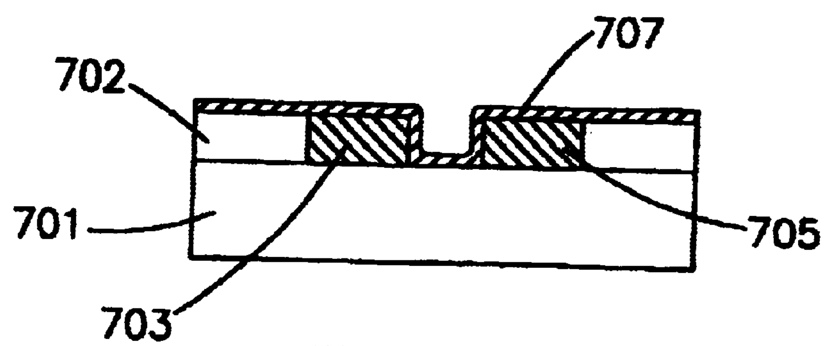

FIGS. 7A through 7F provide illustration of a process flow for fabricating the high-k decoupling capacitor of FIG. 4. FIG. 7A shows a first substrate 701 having metal lines 703 and 705 disposed in openings formed in dielectric 702. The steps for fabricating the metal lines are not part of the present invention and can be done in accordance with the prior art (for example, Damascene processing with a chem-mech polish planarization step). After the metal lines with adjacent dielectric layer have been formed, a photoresist 704 is applied and patterned to serve as the mask for removal of the dielectric material 702 between the metal lines 703 and 705 as shown in FIG. 7B. Removal of the dielectric material can be done with a selective etching process such as $CF_4$ plasma etch, preferably with an etch ratio of dielectric-to-metal etching of more than 10:1. Once the dielectric material 702 has been removed from between the metal lines, an optional electrically conductive diffusion barrier 707 is deposited, as shown in FIG. 7C, using a conventional process such as sputtering.

Figure 7D:
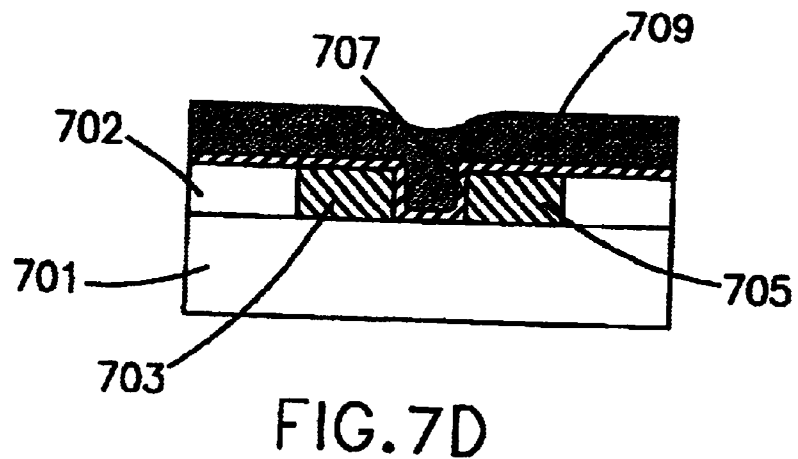
Figure 7E:
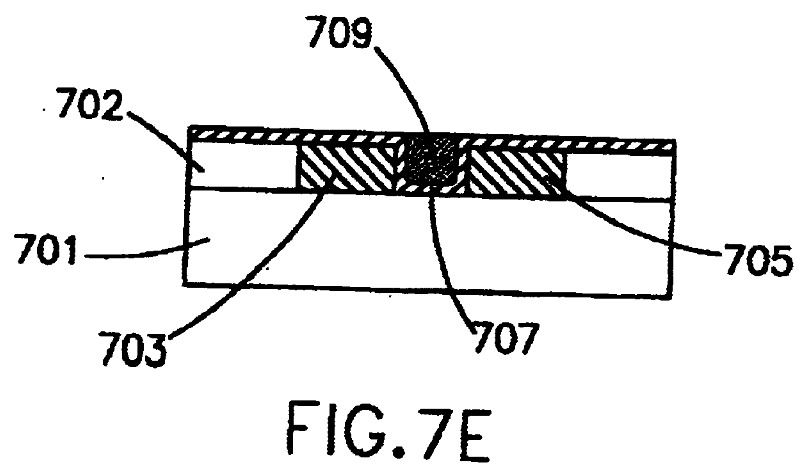
Figure 7F:
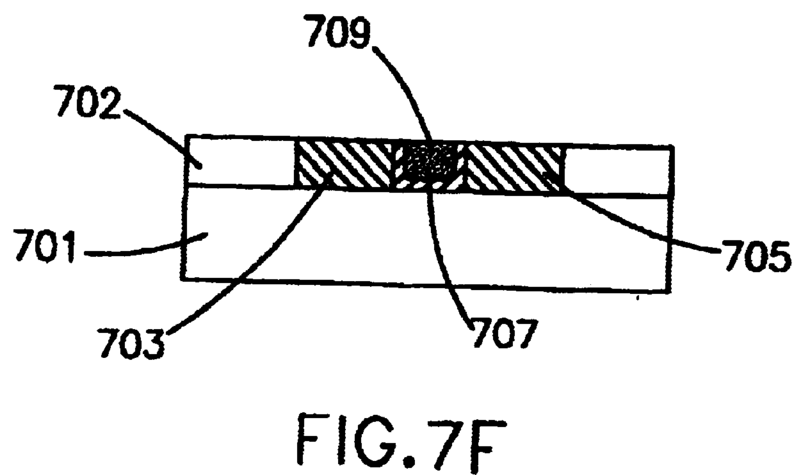

As shown in FIG. 7D, a conformal layer of high-k material is deposited over the dielectric material 702, the metal lines 703 and 705 and the electrically conductive diffusion barrier 707. The high-k material may be deposited using rf magnetron sputtering or a similar suitable process, often followed by an annealing process. Thereafter, the high-k material is etched, using a chem-mech polish, to remove the high-k material 709 from the surface of the dielectric material 702 and the metal lines 703 and 705 to yield the structure shown in FIG. 7E. Excess barrier material 707 can be chemically etched mechanically polished from the surface of the metal lines 703 and 705 and from the dielectric material 702, to yield the structure shown in FIG. 7F. A lateral planar capacitor is thus formed which comprises a left electrode formed by the first metal wiring 703, a right electrode formed by the second metal wiring 705 and a high-k dielectric 709 in between.

Figure 8A:
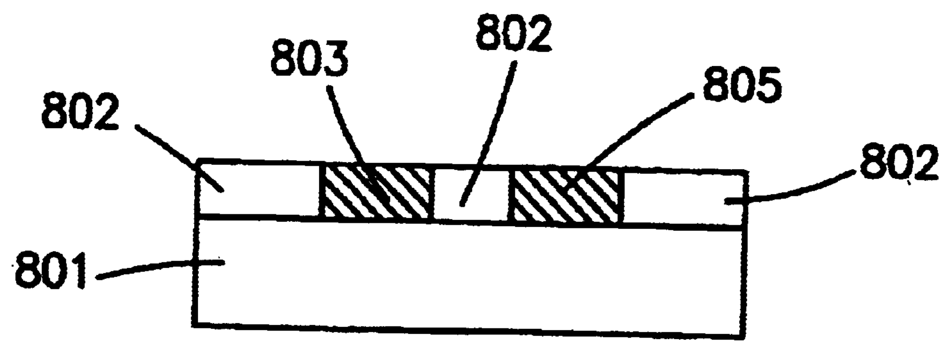
FIGS. 8A through 8K provide illustration of a process flow for fabricating the on-chip decoupling capacitor of FIG. 5.
Figure 8B:
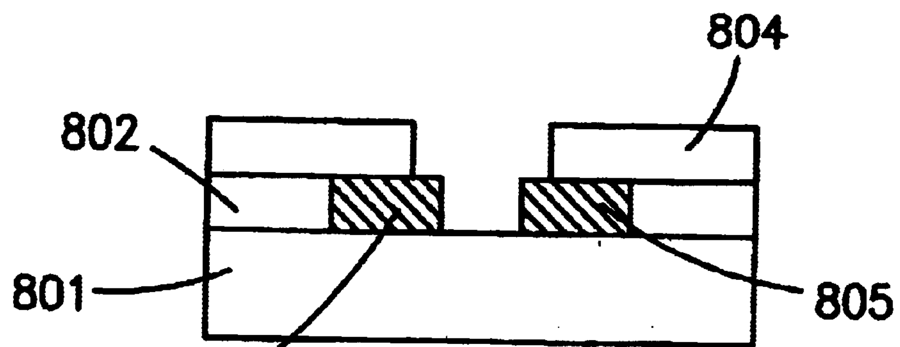
Figure 8C:
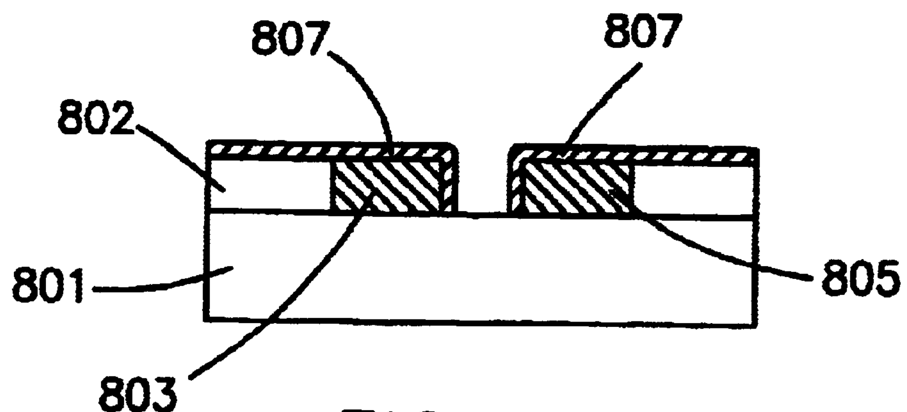
Figure 8D:
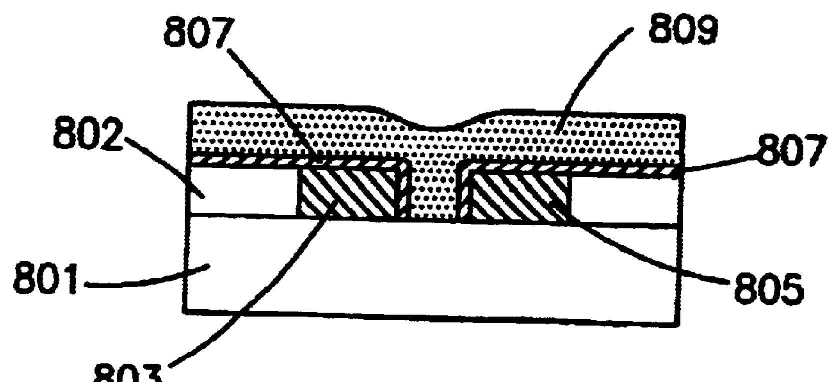
Figure 8E:
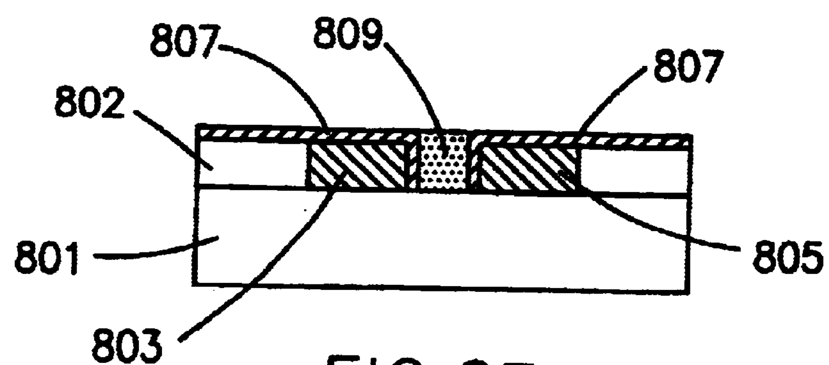
Figure 8F:
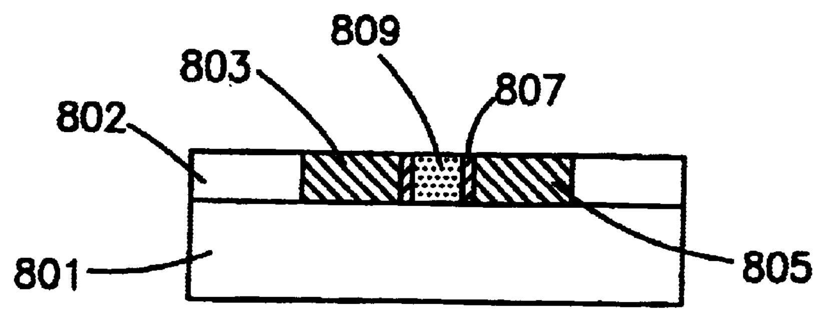

FIGS. 8A through 8F provide illustration of a process flow for fabricating the high-k decoupling capacitor of FIG. 5. As with the processing set forth above, the process comprises first forming metal lines 803 and 805 in dielectric layer 802 of FIG. 8A using conventional methods. After the metal lines with adjacent dielectric layer have been formed, a photoresist 804 is applied and patterned to serve as the mask for removal of the dielectric material 802 between the metal lines 803 and 805 to yield the structure shown in FIG. 8B. Once the dielectric material 802 has been removed from between the metal lines, an electrically conductive diffusion barrier 807 is deposited, as shown in FIG. 8C, using a conventional process such as sputtering. In FIG. 8D a conformal layer of high-k material is deposited over the dielectric material 802, the metal lines 803 and 805 and the electrically conductive diffusion material 807. Thereafter, the high-k material is etched, using a chem-mech polish to remove the high-k material 809 from the surface of the dielectric material 802 and the metal lines 803 and 805 to yield the structure shown in FIG. 8E. Excess barrier material 807 can be mechanically etched from the surface of the metal lines 803 and 805 and from the dielectric material 802, to yield the structure shown in FIG. 8F.

Figure 8G:
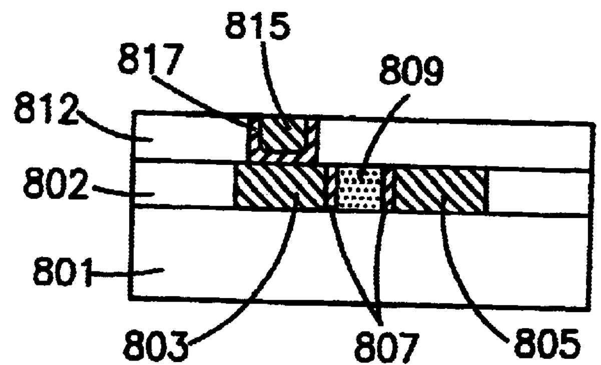
Figure 8H:
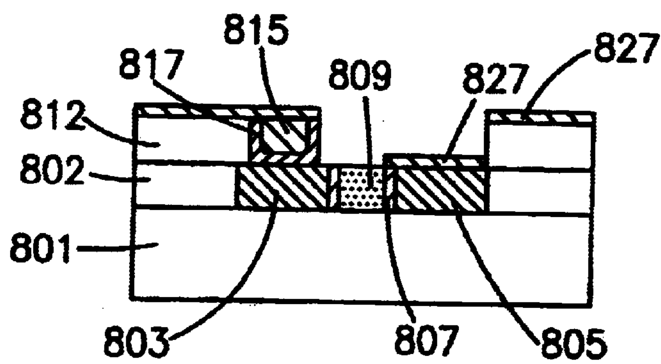
Figure 8I:
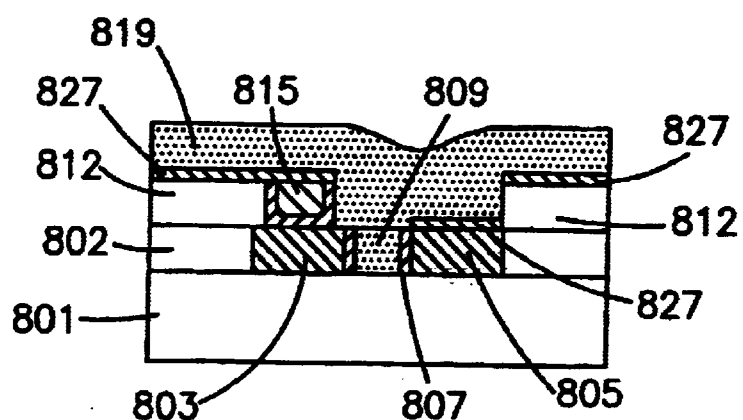
Figure 8J:
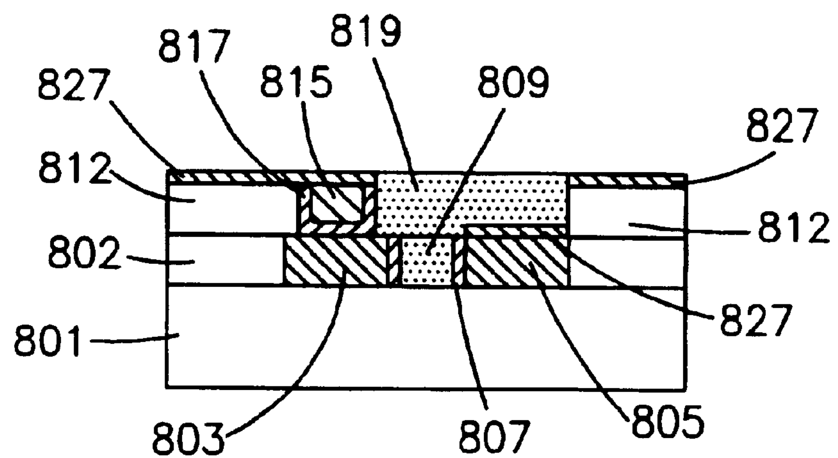
Figure 8K:
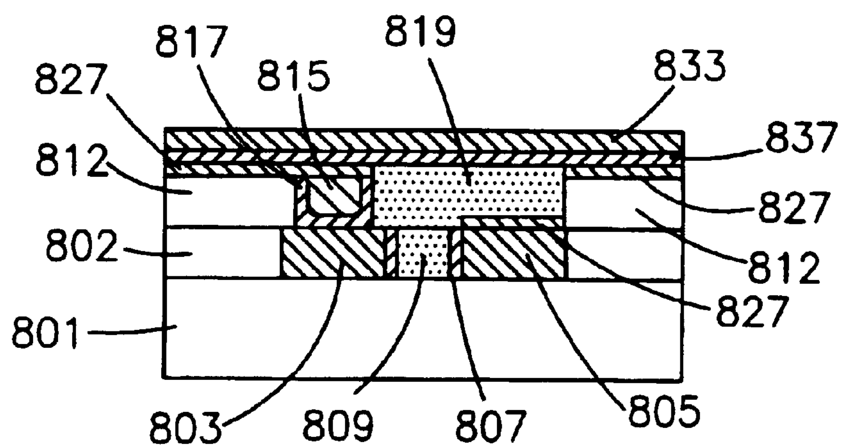

To process further, a higher level of interconnect with a similar high-k material capacitor is formed. The process comprises first forming metal contact 815 with conductive adhesion liner 817 in second dielectric layer 812 as shown in FIG. 8G. The metal contact 815 can be formed by Damascene processing such as is used to form metal wires. The second dielectric layer is patterned, for example by depositing a photoresist and etching an opening in the dielectric using a selective etch, as was described with reference to layer 802 above. Once the opening in the dielectric layer 812 has been defined, an electrically conductive diffusion material 827 is deposited on the top of the structure as shown in FIG. 8H. High-k material 819 is conformally deposited over the electrically conductive diffusion barrier layer 827 as shown in FIG. 8I. Thereafter, the high-k material is polished back to the electrically conductive diffusion barrier, as shown in FIG. 8J, followed by etching of the electrically conductive diffusion barrier layer 827. Another diffusion barrier metal 837 is deposited, followed by formation of a top metal wire 833 by metal etching using a photoresist as a mask to first etch the metal and then remove the exposed diffusion barrier layer 837. The resulting cross-sectional view is shown in FIG. 8K. The high-k material 819 is sandwiched between two metal lines 805 and 833, thereby forming the vertical decoupling capacitor.

While the inclusion of either a vertical or a lateral decoupling capacitor on the chip will enhance performance, the optimal advantages can be realized by the physical structure shown in FIG. 5 which consists of the both types of decoupling capacitors. The capacitor between the adjacent power and ground lines can provide larger capacitance, but requires more processing steps to fabricate than does the interlevel capacitor. The capacitors between two levels of interconnects in the vertical direction can be easily fabricated and do not require that the power lines be placed next to each other.

Figure 9:
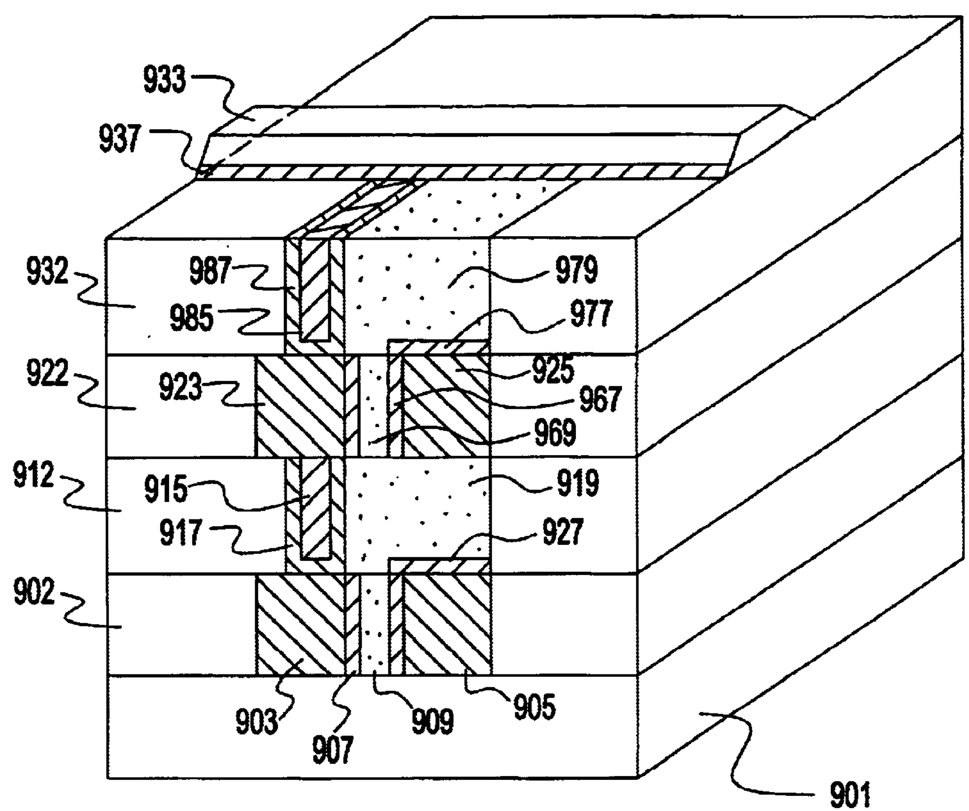
FIG. 9 provides a side perspedctive view of an alternative vertical embodiment of a decoupling capacitor with multiple successive layers in accordance with the present invention.

FIG. 9 provides a side perspective view of an alternative embodiment of a high-k decoupling capacitor in accordance with the present invention wherein the high-k material is. vertically disposed between metal lines on the semiconductor substrate. The materials which are suitable for the lateral embodiment would necessarily be appropriate for the vertical embodiment and will not be repeated herein. The vertical capacitor is formed of metal line 905, metal line 915 and high-k material 919. The metal line 905 is formed in dielectric layer 902 on substrate 901. A diffusion barrier layer 927 is disposed between the metal line 905 and the high-k material 919. In addition, a diffusion barrier layer 927 is needed to isolate the hiqh-k material from the underlying metal 905. Further, a conducting metal liner 917 is disposed in layer 912 to ensure adhesion of the metal stud 915. Metal stud 915 is formed in dielectric layer 912 and provides an interconnection between the underlying metal line 903 and the overlying metal. Next, a successive structure formed in layers 922 and 932 is disposed above the structure. Metal lines 923 and 925 are formed in dielectric layer 922 above the layer comprising 912, 917, 915, 919 and 927. A diffusion barrier layer 967 is disposed between the metal line 925 and the high-k material 969. In addition, a diffusion barrier layer 977 is needed to isolate the high-k material 979 from the underlying metal 925. Further, a conducting metal liner 987 is disposed in layer 932 to ensure adhesion of the metal stud 935. Metal stud 985 is formed in dielectric layer 932 and provides an interconnection between the underlying metal line 923 and the overlying metal 985. Another diffusion barrier layer 937 is disposed and patterned on the surface of the structure prior to depositing metal line 933.

The invention has been described with reference to several specific embodiments. One having skill in the relevant art will recognize that modifications may be made without departing from the spirit and scope of the invention as set forth in the appended claims.

Having thus described our invention, what we claim as new and desire to secure by Letters Patent is:

1. A semiconductor structure comprising:

a substrate;

two or more adjacent conductors, disposed in at least one dielectric layer formed over said substrate, and electrically isolated from each other, wherein each pair of adjacent conductors is separated by a gap; and a first high dielectric constant material filling in the gap between two adjacent conductors, said first high dielectric constant material being a different material from and having a higher dielectric constant than said at least one dielectric.

2. The semiconductor structure of claim 1, wherein at least one successive conductor level comprising at least one conductor is provided over the adjacent conductors, further comprising second high dielectric constant material disposed between at least one of the adjacent conductors and the at least one successive conductor level.

3. The semiconductor structure of claim 2 wherein at least one pair of adjacent conductors comprises a pair of metal lines.

4. The semiconductor structure of claim 3 wherein the at least one successive conductor level comprises a first successive level comprising at least one conductive via electrically coupled to at least one of the pair of metal lines.

5. The semiconductor structure of claim 4 wherein the at least one successive conductor level additionally comprises a second conductor level comprising additional adjacent conductors disposed above the first successive level.

6. The semiconductor structure of claim 5 wherein the second conductor level additionally comprises third high dielectric constant material disposed between the additional adjacent conductors.

7. The semiconductor structure of claim 6 further comprising at least one electrically conductive barrier material disposed between the third high dielectric constant material and the additional adjacent conductors.

8. The semiconductor structure of claim 2 further comprising at least one electrically conductive barrier material disposed between the second high dielectric constant material and the at least one conductor.

9. The semiconductor structure of claim 1 wherein the high dielectric constant material is selected from the group consisting of ferroelectrics, relaxors, paraelectrics, perovskites, pyrochlores, layered perovskites or any material with a dielectric constant which is greater than 10.

10. The semiconductor structure of claim 1 wherein the conductors are fabricated from at least one of the group consisting of Au, Pt, Pd, Ir, Rh, Ru, Mo, Al, Cu, W, their alloys, and doped polysilicon.

11. The semiconductor structure of claim 1 further comprising a diffusion barrier material formed between said high dielectric constant material and said conductors.

12. The semiconductor structure of claim 11 wherein the diffusion barrier material is selected from the group consisting of $RuO_2$, $IrO_2$, $Re_2O_3$, TiN, TaN and TaSiN.

13. The semiconductor structure of claim 1 wherein at least one pair of adjacent conductors comprises a power supply line an a ground wire.

14. The semiconductor structure of claim 1 wherein the gap is in the range of 0.1 to 2.0 microns.

* * * * *